(12) United States Patent
Uchida

(10) Patent No.: US 9,881,851 B2
(45) Date of Patent: Jan. 30, 2018

(54) SEMICONDUCTOR DEVICE AND METHOD FOR PRODUCING SEMICONDUCTOR DEVICE

(71) Applicant: TOSHIBA MEMORY CORPORATION, Tokyo (JP)

(72) Inventor: Kengo Uchida, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/062,002

(22) Filed: Mar. 4, 2016

(65) Prior Publication Data

US 2016/0351473 A1 Dec. 1, 2016

(30) Foreign Application Priority Data

May 29, 2015 (JP) ................. 2015-110452

(51) Int. Cl.
*H01L 23/48* (2006.01)
*H01L 23/00* (2006.01)
(Continued)

(52) U.S. Cl.
CPC ...... *H01L 23/481* (2013.01); *H01L 21/76898* (2013.01); *H01L 24/03* (2013.01); *H01L 24/05* (2013.01); *H01L 24/16* (2013.01); *H01L 25/0657* (2013.01); *H01L 2224/03002* (2013.01); *H01L 2224/03005* (2013.01); *H01L 2224/0345* (2013.01); *H01L 2224/0346* (2013.01); *H01L 2224/0347* (2013.01); *H01L 2224/03452* (2013.01); *H01L 2224/03614* (2013.01); *H01L 2224/03831* (2013.01); *H01L 2224/03914* (2013.01);
(Continued)

(58) Field of Classification Search
CPC ................................... H01L 23/481
See application file for complete search history.

(56) References Cited

U.S. PATENT DOCUMENTS 5,229,647 A * 7/1993 Gnadinger ............... G11C 5/00
257/686
5,404,044 A * 4/1995 Booth ............... H01L 23/49827
257/686
(Continued)

FOREIGN PATENT DOCUMENTS

JP 2010021352 A 1/2010

OTHER PUBLICATIONS

Taiwan Office Action dated May 12, 2017, filed in Taiwan counterpart Application No. 165104182, 6 pages (with translation).

*Primary Examiner* — Eugene Lee
(74) *Attorney, Agent, or Firm* — Patterson & Sheridan, LLP

(57) ABSTRACT

A semiconductor device includes a semiconductor substrate, a device layer located at an upper surface of the semiconductor substrate, an insulating layer located on the device layer, and a through electrode. The through electrode includes a body located in a through hole provided in the insulating layer and a head located on the body and the insulating layer and is electrically connected to an upper-layer wiring in the device layer. A perimeter of the head on a lower surface side thereof is smaller than a perimeter of the head on an upper surface side thereof.

24 Claims, 11 Drawing Sheets

(51) Int. Cl.
*H01L 21/768* (2006.01)
*H01L 25/065* (2006.01)

(52) U.S. Cl.
CPC ............. *H01L 2224/0401* (2013.01); *H01L 2224/05009* (2013.01); *H01L 2224/05017* (2013.01); *H01L 2224/05018* (2013.01); *H01L 2224/05027* (2013.01); *H01L 2224/0557* (2013.01); *H01L 2224/05155* (2013.01); *H01L 2224/05564* (2013.01); *H01L 2224/05568* (2013.01); *H01L 2224/05644* (2013.01); *H01L 2224/06181* (2013.01); *H01L 2224/13025* (2013.01); *H01L 2224/13111* (2013.01); *H01L 2224/16146* (2013.01); *H01L 2224/16148* (2013.01); *H01L 2225/06513* (2013.01); *H01L 2225/06517* (2013.01); *H01L 2225/06541* (2013.01)

(56) References Cited

U.S. PATENT DOCUMENTS

| | | | | |
|---|---|---|---|---|
| 6,162,997 | A * | 12/2000 | Memis | H01L 23/5384 174/260 |
| 6,703,712 | B2 * | 3/2004 | Gilkes | H01L 21/76877 257/751 |
| 6,903,442 | B2 * | 6/2005 | Wood | H01L 21/76831 257/621 |
| 8,030,780 | B2 * | 10/2011 | Kirby | H01L 21/76898 257/680 |
| 8,531,009 | B2 * | 9/2013 | Lin | H01L 21/76898 257/621 |
| 2004/0256734 | A1 * | 12/2004 | Farnworth | H01L 21/561 257/777 |
| 2005/0233581 | A1 * | 10/2005 | Soejima | H01L 21/76898 438/667 |
| 2006/0115932 | A1 * | 6/2006 | Farnworth | H01L 21/486 438/125 |
| 2009/0102021 | A1 * | 4/2009 | Chen | H01L 21/6835 257/621 |
| 2009/0108468 | A1 * | 4/2009 | Han | H01L 21/76898 257/777 |
| 2009/0130846 | A1 * | 5/2009 | Mistuhashi | H01L 21/6835 438/667 |
| 2011/0086486 | A1 * | 4/2011 | Lee | H01L 21/76898 438/381 |
| 2012/0034759 | A1 * | 2/2012 | Sakaguchi | H01L 21/563 438/458 |
| 2012/0056330 | A1 * | 3/2012 | Lee | H01L 21/76898 257/774 |
| 2012/0068330 | A1 * | 3/2012 | Oganesian | H01L 21/76898 257/698 |
| 2012/0139082 | A1 * | 6/2012 | Oganesian | H01L 21/76898 257/531 |
| 2012/0139094 | A1 * | 6/2012 | Haba | H01L 21/486 257/690 |
| 2012/0142185 | A1 * | 6/2012 | Park | H01L 21/76898 438/667 |
| 2012/0256300 | A1 * | 10/2012 | Nakamura | H01L 21/76898 257/621 |
| 2013/0252416 | A1 * | 9/2013 | Takeda | H01L 21/76898 438/630 |
| 2014/0035164 | A1 * | 2/2014 | Moon | H01L 23/5226 257/774 |
| 2015/0137353 | A1 * | 5/2015 | Wirz | H01L 23/481 257/737 |
| 2015/0311141 | A1 * | 10/2015 | Wu | H01L 21/30625 257/774 |

* cited by examiner

SEMICONDUCTOR DEVICE AND METHOD FOR PRODUCING SEMICONDUCTOR DEVICE

CROSS-REFERENCE TO RELATED APPLICATION

This application is based upon and claims the benefit of priority from Japanese Patent Application No. 2015-110452, filed May 29, 2015, the entire contents of which are incorporated herein by reference.

FIELD

Embodiments described herein relate generally to semiconductor devices and methods for producing the semiconductor device.

BACKGROUND

So called "3D" or "2.5D" semiconductor device integration technology, which uses a through-silicon via (TSV), is getting attention for the possibility of achieving greater device (integrated circuit) functionality and the like.

In the integration technology using a TSV, a solder bump (also called a through electrode) may be formed on both the upper and lower surfaces of a chip/die. The bump on the lower surface side of the chip/die is typically formed while the upper surface side of the chip/die (which typically the side on which circuit components are formed which the chip/die is in a wafer state) is adhered to a supporting substrate. To bond the upper surface of the chip/die (while in a wafer state) and the supporting substrate together, an adhesive, for example, is used. Often a bump or protrusion (to be used to subsequently join the chip/die to another element) will also be formed on the upper surface of the chip/die before the support substrate is adhered to the wafer. Moreover, before the formation of the bump on the lower surface side of the wafer, the wafer is sometimes first ground to make the wafer thinner.

As described above, since the lower surface side of the wafer is machined (e.g., subjected to grinding to reduce overall wafer thickness) in this 3D and 2.5D integration technology, bonding between the upper surface of the wafer and the supporting substrate is required to have high strength to prevent a bonding breakdown at the time of machining of the lower surface side of the wafer. However, depending on the height of bump or protrusion on the upper surface side of the wafer or the shape of the element structure, adequate bonding strength sometimes cannot be obtained.

DETAILED DESCRIPTION

Embodiments provide a semiconductor device and a method for producing the semiconductor device, the semiconductor device and the method that can increase the bonding strength between the upper surface of a wafer and a supporting substrate.

In general, according to one embodiment, a semiconductor device includes a semiconductor substrate, a device layer located at an upper surface of the semiconductor substrate, an insulating layer located on the device layer; and a through electrode that includes a body located in a through hole provided in the insulating layer and a head being located on the body and the insulating layer and is electrically connected to an electrode in the device layer through the through hole of the insulating layer. A perimeter of the head on a lower surface side thereof is smaller than a perimeter the head on an upper surface side thereof.

Hereinafter, with reference to the attached drawings, example semiconductor devices and methods for producing the semiconductor devices according to embodiments will be described in detail. Incidentally, the scope of the present disclosure is not limited by the following description of example embodiments.

First Embodiment

In the following description, for explanatory convenience, an element formation surface of a semiconductor substrate is referred to as the upper surface and the surface of the substrate that is opposite to this upper surface is treated as a lower surface.

Figure 1:
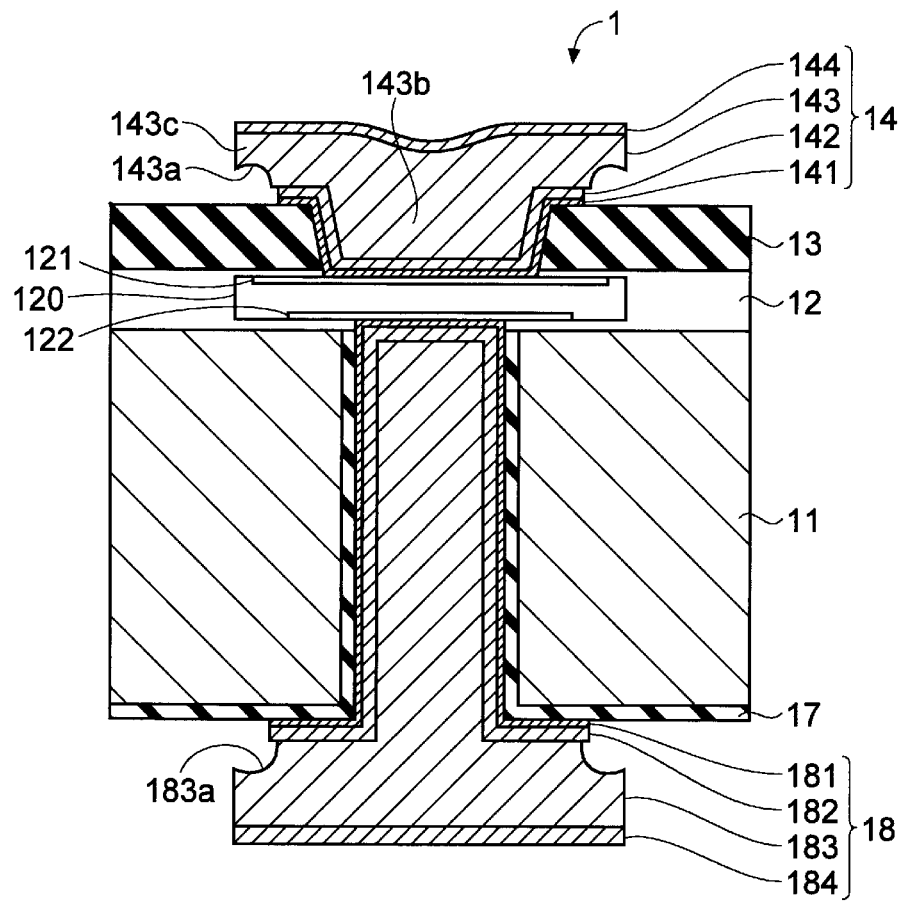
FIG. 1 is a cross-sectional view depicting a schematic configuration example of a semiconductor device according to a first embodiment.

FIG. 1 is a view depicting a schematic configuration example of the semiconductor device according to the first embodiment. As depicted in FIG. 1, a semiconductor device 1 includes a semiconductor substrate 11, a device layer 12, an insulating layer 13, an upper-surface through electrode 14, an insulating layer 17, and a lower-surface through electrode 18.

The semiconductor substrate 11 is a silicon substrate, for example. The semiconductor substrate 11 may be made thinner to have a thickness of 50 μm (micrometers) or less, for example, a thickness of about 30 μm (±5 μm).

The device layer 12 includes an element structure which is formed on the upper surface side of the semiconductor substrate 11 and which is an element formation surface, and an interlayer dielectric in which the element structure is buried. The interlayer dielectric may be a silicon dioxide film ($SiO_2$). The element structure includes a wiring layer 120 formed in the device layer 12. The wiring layer 120 includes an upper-layer wiring 121 formed in an upper layer and a lower-layer wiring 122 formed in a lower layer. Incidentally, the upper layer and the lower layer of the device layer 12 may be an upper layer and a lower layer with respect to the element formation surface of the semiconductor substrate 11.

The insulating layer 13 covers the device layer 12 to protect the device layer 12. The insulating layer 13 may include a passivation layer formed of a silicon nitride film (SiN), for example, which covers the device layer 12 and an organic layer covering the passivation layer. As the organic layer, a resin material such as a photosensitive polyimide can be used.

The upper-surface through electrode 14 electrically connects to the upper-layer wiring 121 in an area in the insulating layer 13 by being provided in a through hole passing through the insulating layer 13 and to the upper-layer wiring 121 in the device layer 12 there making contact with the upper-layer wiring 121. The upper-surface through electrode 14 may include a barrier metal layer (a first metal layer) 141 covering at least the inner surface of the through hole, a seed metal layer (a second metal layer) 142 on the barrier metal layer 141, and a through electrode 143 on the seed metal layer 142. On the through electrode 143, a material film 144 which functions at the time of vertical integration of the semiconductor device 1 may be provided.

As the barrier metal layer 141, titanium (Ti), tantalum (Ta), ruthenium (Ru), or the like may be used. As the seed metal layer 142, copper (Cu), a stacked film (Ni/Cu) of nickel and copper, or the like may be used. As the through electrode 143, nickel (Ni) or the like may be used. As the material film 144, gold (Au) or the like may be used. However, the layer structure and the material of the upper-surface through electrode 14 can be changed as appropriate depending on a purpose. For example, the layer structure and the material of the barrier metal layer 141/the seed metal layer 142 or the material film 144 may be changed as appropriate depending on a conductive material used in the through electrode 143 and a formation method.

The lower-surface through electrode 18 electrically connects to the lower-layer wiring 122 in an area under the semiconductor substrate 11 by being provided in a through hole (a TSV) reaching the lower-layer wiring 122 in the device layer 12 from the semiconductor substrate 11 and there making contact with the lower-layer wiring 122. From the internal surface of the through hole to the lower surface of the semiconductor substrate 11, the insulating layer 17 for preventing a short circuit between the lower-surface through electrode 18 and the semiconductor substrate 11 is provided. As the insulating layer 17, various insulating films such as a single-layer film formed as a silicon dioxide film ($SiO_2$) and a stacked film formed of two or more layers including a silicon dioxide film and a silicon nitride film (SiN) may be used.

As is the case with the upper-surface through electrode 14, the lower-surface through electrode 18 may include a barrier metal layer 181 covering at least the inner surface of the through hole, a seed metal layer 182 on the barrier metal layer 181, and a through electrode 183 on the seed metal layer 182. On the through electrode 183, a material film 184 which functions at the time of vertical integration of the semiconductor device 1 may be provided. Moreover, the metallic materials used in these component elements may be the same as the metallic materials of the upper-surface through electrode 14.

Here, the shape of the through electrode 143 in the upper-surface through electrode 14 will be described. Incidentally, in the following description, the through electrode 143 includes a cylindrical body 143b and a head 143c having the shape of a virtually flat plate and having diameter greater than the diameter of the body 143b, and a surface of the head 143c on one side where the body 143b is located is treated as a lower surface and a surface opposite to this lower surface is treated as an upper surface.

Figure 2:
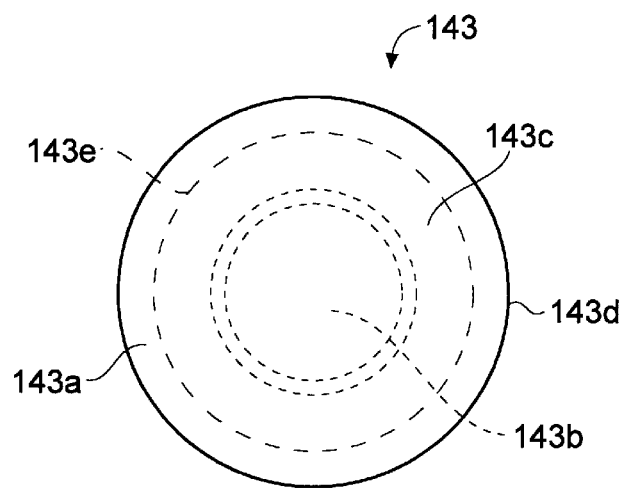
FIG. 2 is a top view of a through electrode according to the first embodiment.

FIG. 2 is a top view of the through electrode 143. As depicted in FIG. 2, the head 143c of the through electrode 143 has a shape in which the size of an outline 143e thereof on the lower surface side is size smaller than the size of an outline 143d thereof on the upper surface side. This difference between the size of the head 143c on the upper surface side and the size thereof on the lower surface side is achieved by a depression 143a provided from the side surface to the lower surface of the head 143c. The depression 143a is provided throughout the side surface of the head 143c, and the inner surface of the depression 143a is a curved undercut surface. However, the above description does not exclude various shapes such as a shape in which a sharp edge such as in a square depression is formed in part of the inner surface and a shape in which the depression 143a is provided in only a part of the side surface of the head 143c. Even when the depression 143a is provided in part of the side surface of the head 143c, not in the entire part of the side surface, the contact area of an adhesive which is used to fix, to the supporting substrate or the like, the semiconductor device 1 or a wafer from which the semiconductor devices 1 are to be cut, for example, can be increased and the bonding strength between the semiconductor device 1 or the wafer and the supporting substrate or the like can be increased.

As described above, by making the size of the head 143c on the upper surface which protrudes from the insulating layer 13 greater than the size thereof on the lower surface, the contact area of the adhesive which is used to fix, to the supporting substrate or the like, the semiconductor device 1 or the wafer from which the semiconductor devices 1 are to be cut, for example, can be increased. As a result, the bonding strength between the semiconductor device 1 or the wafer and the supporting substrate or the like can be increased. Moreover, as a result of the depression 143a being provided from the side surface to the lower surface of the head 143c, the adhesion strength is further increased by an anchor effect. Thus, the bonding strength between the semiconductor device 1 or the wafer and the supporting substrate or the like can be further increased.

Incidentally, in FIG. 2, a case in which the upper surface of the head 143c is circular in shape is depicted as an example, but the shape is not limited to a circular shape. For example, the upper surface of the head 143c may be oval or polygonal in shape. Furthermore, if the upper surface of the head 143c is polygonal in shape, each corner may be rounded.

Figure 3:
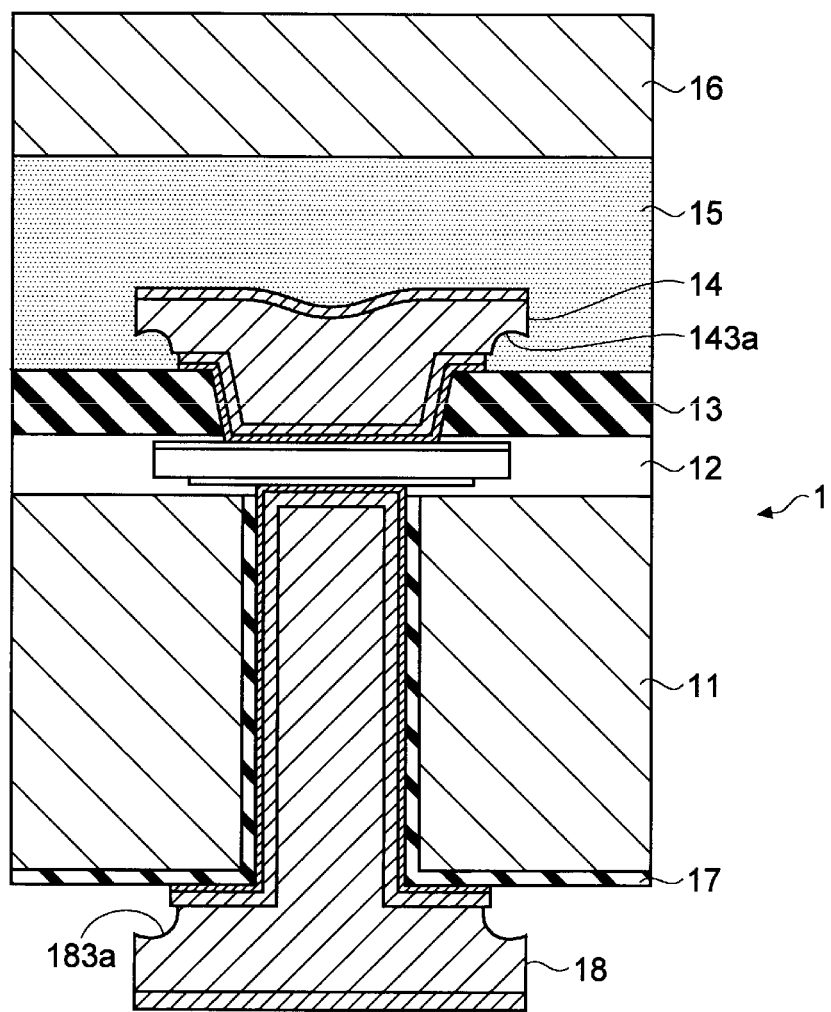
FIG. 3 is a cross-sectional view depicting a schematic configuration example observed when the semiconductor device according to the first embodiment is fixed to a supporting substrate by using an adhesive.

FIG. 3 is a sectional view depicting a schematic configuration example of the semiconductor device 1 fixed to the supporting substrate by using an adhesive. Incidentally, the semiconductor device 1 depicted in FIG. 3 may be a semiconductor device which is part of a wafer from which semiconductor devices are to be cut. As depicted in FIG. 3, an adhesive 15 applied to the upper surface side of the semiconductor device 1 also spreads to an area under the depression 143a provided in the head 143c. Thus, the contact area of the adhesive is increased and the adhesion strength is increased, and, in addition thereto, the adhesion strength is further increased by the anchor effect of the adhesive in the depression 143. As a result, the bonding strength between the semiconductor device 1 and the supporting substrate 16 is increased.

Figure 4:
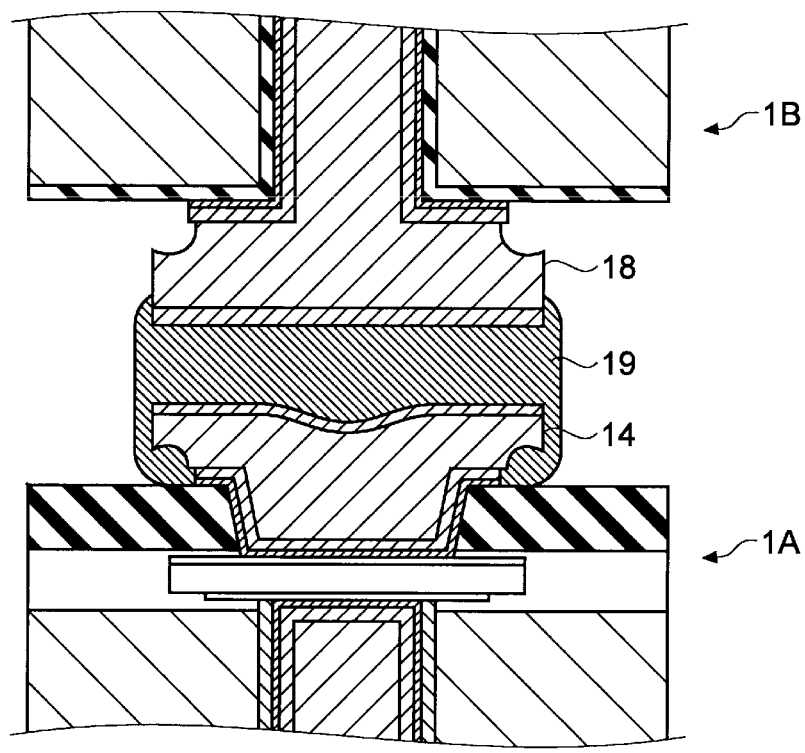
FIG. 4 is a cross-sectional view depicting a schematic configuration example of a connection portion observed when the semiconductor devices according to the first embodiment are integrated in a vertical direction.

FIG. 4 is a sectional view depicting a schematic configuration example of a connection portion between two semiconductor devices integrated in a vertical direction. As depicted in FIG. 4, when two semiconductor devices: semiconductor devices 1A and 1B are integrated in the vertical direction, the upper-surface through electrode 14 of one semiconductor device 1A and the lower-surface through electrode 18 of the other semiconductor device 1B are bonded together by using tin (Sn) solder 19 or the like. In so doing, the tin solder 19 which is not yet hardened can spread even to an area under the depression 143a provided in the head 143c. As a result, by the same effect as the effect described in FIG. 3, the bonding strength between the semiconductor devices 1A and 1B integrated in the vertical direction can be increased.

Incidentally, the above-described effect obtained by the depression 143a of the upper-surface through electrode 14 can also be obtained by a depression 183a of the lower-surface through electrode 18.

Next, a method for producing the semiconductor device 1 according to the first embodiment will be described in detail with reference to the drawings. FIGS. 5 to 12 are process sectional views depicting the result of processes in a method for producing the semiconductor device according to the first embodiment. Incidentally, in FIGS. 5 to 12, a description is given by using a cross section similar to FIG. 1. However, in FIGS. 10 to 12, for convenience of explanation, the top and the bottom in each cross section correspond to the bottom and the top, respectively, in each of FIGS. 5 to 9.

Figure 5:
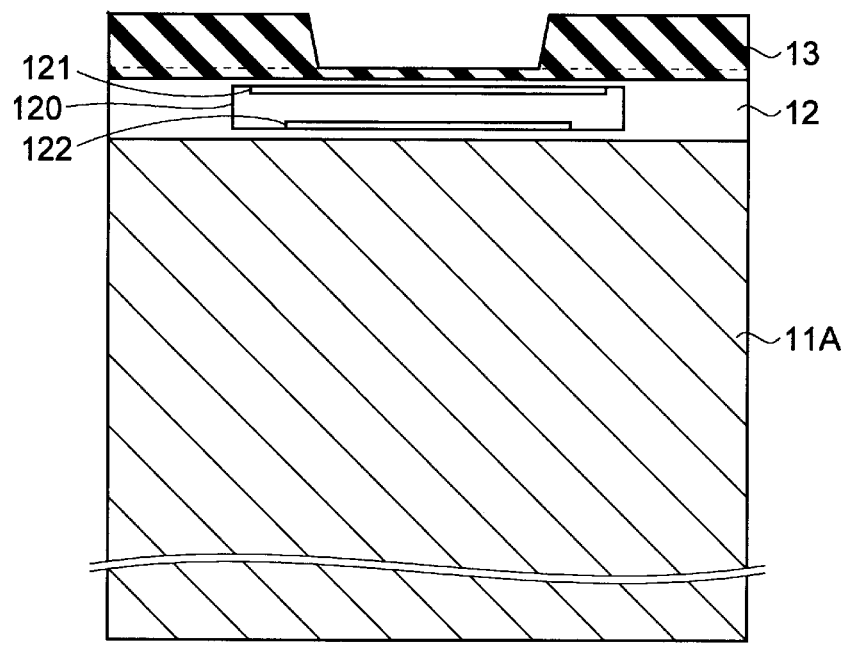
FIG. 5 is a cross-sectional view (I) depicting a method for producing the semiconductor device according to the first embodiment.

First, in the first embodiment, an element structure is formed on the element formation surface (the upper surface) of the semiconductor substrate 11, and the element structure thus formed is covered with an interlayer dielectric. As a result, the device layer 12 is formed. Incidentally, the interlayer dielectric may include various insulating films such as a so-called element isolation insulating film and various layers such as a wiring layer. Then, on the device layer 12, the insulating layer 13 is formed. As described earlier, the insulating layer 13 may include a silicon nitride film (SiN) covering the device layer 12 and an organic layer covering the silicon nitride film. As the organic layer, a photosensitive polyimide or the like is used, and an opening pattern for forming the upper-surface through electrode 14 is transferred to the organic layer. As a result, a cross-section structure depicted in FIG. 5 is obtained. Incidentally, the opening size of the opening pattern may be about 10 µm, for example.

Figure 6:
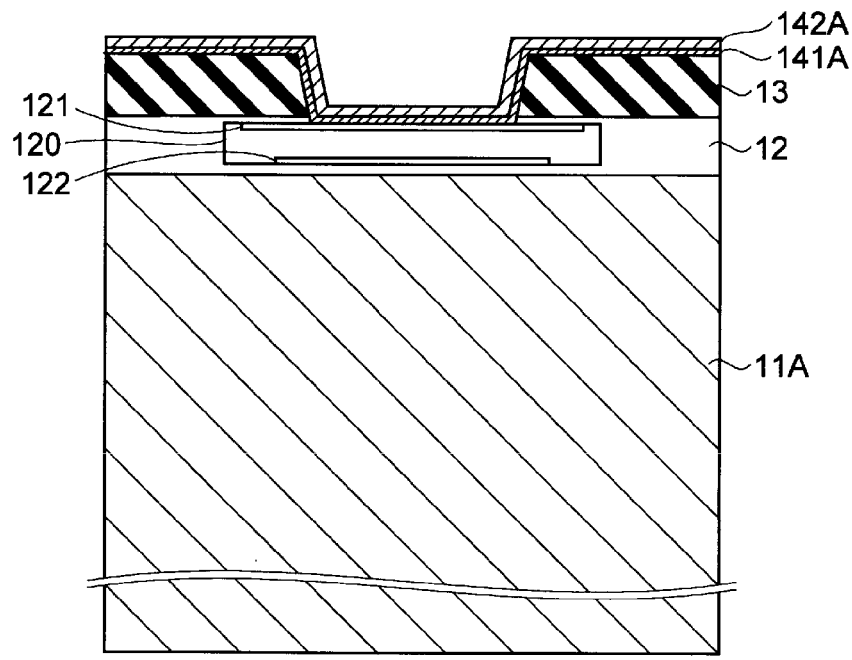
FIG. 6 is a cross-sectional view (II) depicting the method for producing the semiconductor device according to the first embodiment.

Next, by performing etching on the silicon nitride film of the insulating layer 13 and a portion of the device layer 12 located on the interlayer dielectric by using the organic layer as a mask, for example, the upper-layer wiring 121 of the device layer 12 is exposed. In etching of the silicon nitride film and the interlayer dielectric, reactive ion etching (RIE) or the like may be used. Then, by sequentially stacking a barrier metal layer 141A formed of titanium (Ti) and a seed metal layer 142A formed of copper (Cu) all over the insulating layer 13 including the inside of the through hole, a cross section structure depicted in FIG. 6 is obtained. In the formation of the barrier metal layer 141A and the seed metal layer 142A, sputtering, chemical vapor deposition (CVD), or the like may be used. The film thickness of the barrier metal layer 141A thus formed may be about 200 nm (nanometers), for example, and the film thickness of the seed metal layer 142A may be about 200 nm, for example.

Figure 7:
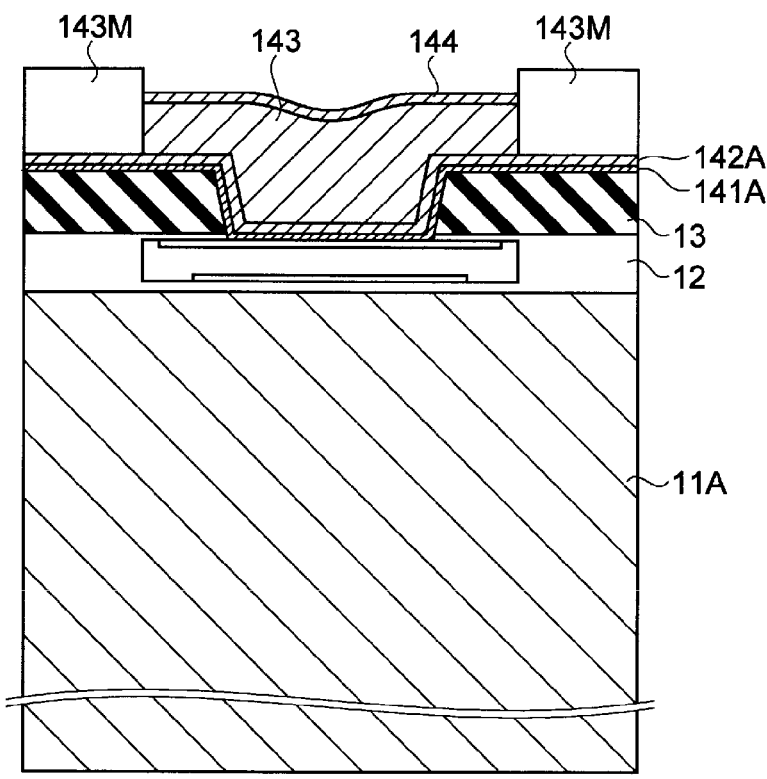
FIG. 7 is a cross-sectional view (III) depicting the method for producing the semiconductor device according to the first embodiment.

Next, a mask 143M for forming the through electrode 143 on the seed metal layer 142A is formed by using the photo engraving process (PEP), for example. In a position in the mask 143M, the position corresponding to the through hole formed in the insulating layer 13, an opening is formed. Then, on the seed metal layer 142A exposed from the opening of the mask 143M, the through electrode 143 formed of nickel (Ni) is formed. In the formation of the through electrode 143, conformal plating or the like may be used. If conformal plating is used, the upper surface of the head 143a of the through electrode 143 thus formed is concave in shape. As described above, by making the head 143a have a concave upper surface which is an adhesive surface to which the tin solder 19 or the like is applied, the adhesion strength can be further increased. Moreover, by using conformal plating in the formation of the through electrode 143, since the concave shape of the head 143a can be formed by reflecting the shape of the seed metal layer 142A which is an underlayer, the concave shape can be easily formed without the addition of a process. However, a process of machining the upper surface of the head 143a by etching or the like to obtain the concave shape may be added. Then, on the upper surface of the through electrode 143 exposed from the mask 143M, the material film 144 formed of gold (Au) is formed. In the formation of the material film 144, a formation method, such as lift-off, which uses the mask 143M may be used. As a result, a cross section structure depicted in FIG. 7 is obtained.

Figure 8:
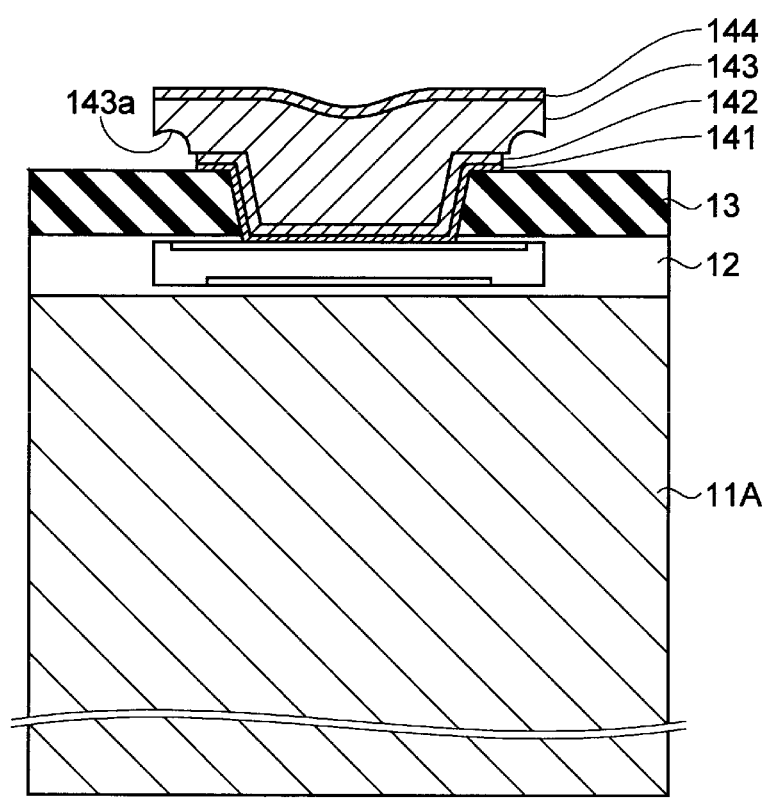
FIG. 8 is a cross-sectional view (IV) depicting the method for producing the semiconductor device according to the first embodiment.

Then, after the mask 143M is removed, the exposed seed metal layer 142A and barrier metal layer 141A are removed. In removal of the seed metal layer 142A and the barrier metal layer 141A, wet etching may be used. As an etchant used in this etching, an electrolyte solution which is a solution in which ions dissolve may be used. As described above, when the seed metal layer 142A and the barrier metal layer 141A are removed by using an etchant which is an electrolyte solution, nickel (Ni) which makes contact with copper (Cu) dissolves by the battery effect (also called the battery action, electrolytic action or the like). As a result, as depicted in FIG. 8, a portion of the through electrode 143 formed of nickel, the portion from the side surface to the lower surface of the head 143c, dissolves and, in this portion, the depression 143a having a curved inner surface is formed.

Figure 9:
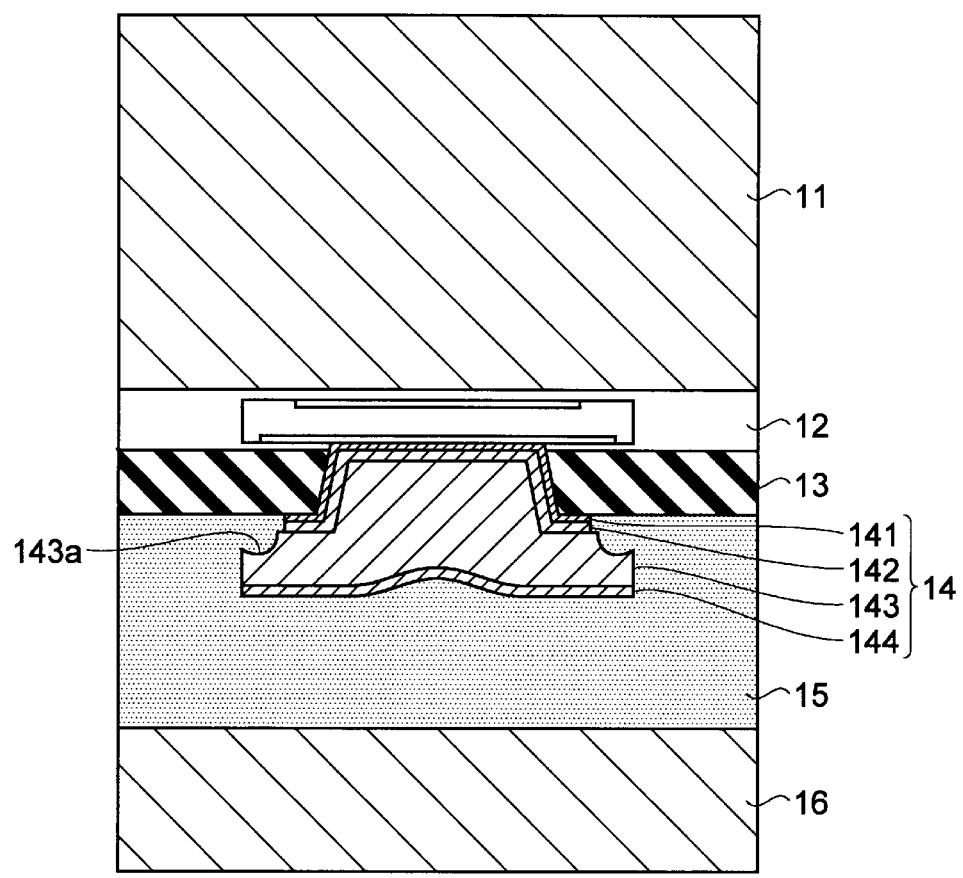
FIG. 9 is a cross-sectional view (V) depicting the method for producing the semiconductor device according to the first embodiment.

Next, an adhesive is applied to the insulating layer 13 in which the upper-surface through electrode 14 is formed and the supporting substrate 16 is bonded to the adhesive, whereby, as depicted in FIG. 9, the supporting substrate 16 is bonded to the element formation surface side of the semiconductor device 1. As the adhesive used in this process, a relatively low-viscosity adhesive may be used with consideration given to the spread of the adhesive into the depression 143a of the through electrode 143. Moreover, the adhesive may be applied in advance to the adhesive surface of the supporting substrate 16.

Figure 10:
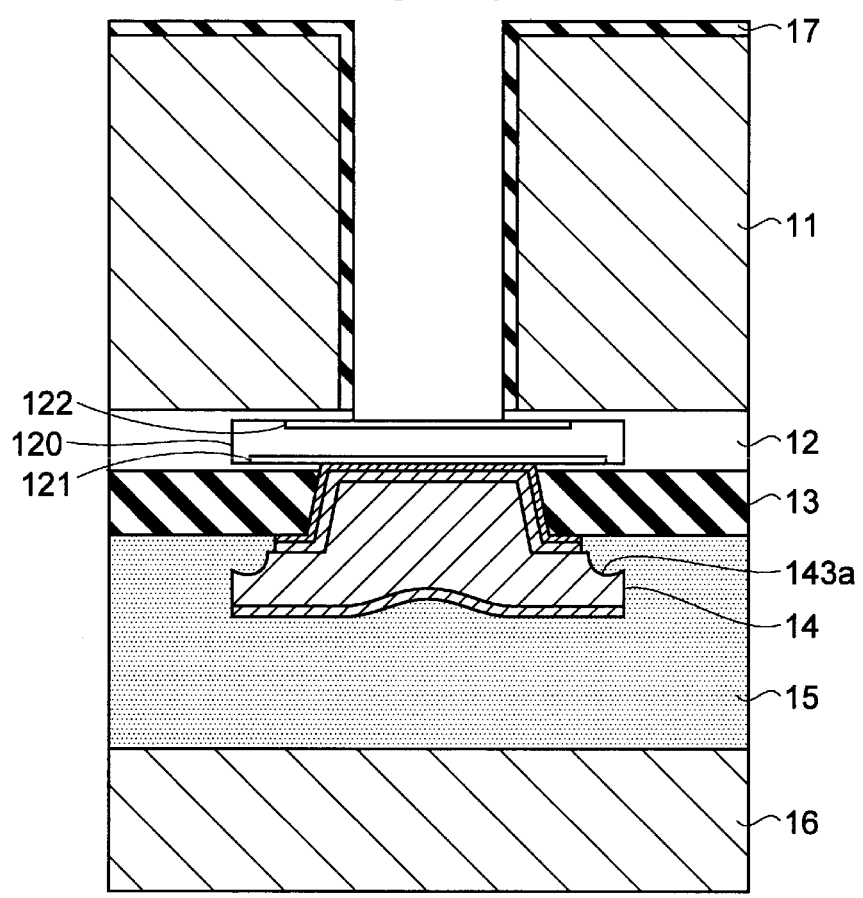
FIG. 10 is a cross-sectional view (VI) depicting the method for producing the semiconductor device according to the first embodiment.

Then, by grinding the semiconductor substrate 11 from a surface thereof (a lower surface in this description) opposite to the element formation surface in a state in which the supporting substrate 16 is fixed to a stage, the semiconductor substrate 11 is made thinner to have a thickness of about 30 µm±5 µm. Next, a silicon dioxide film and a silicon nitride film are sequentially formed on the lower surface of the semiconductor substrate 11. Then, a photosensitive photoresist is applied to the silicon nitride film, and an opening pattern for forming the lower-surface through electrode 18 is transferred to this photoresist. Incidentally, the opening size of the opening pattern may be about 10 µm, for example. Next, by etching the semiconductor substrate 11 from the lower surface side by using, as a mask, the photoresist to which the opening pattern is transferred, a through hole (a TSV) reaching the device layer 12 is formed. In etching of the semiconductor substrate 11, anisotropic dry etching or the like by which a high aspect ratio can be obtained may be used. Then, a silicon dioxide film is formed all over the lower surface of the semiconductor substrate 11 including the inside of the through hole and the silicon dioxide film is etched back, whereby the silicon dioxide film formed at the bottom of the through hole is removed. The above etch-back process is performed until the insulating film (an interlayer dielectric may be included therein) of the device layer 12 is removed and the lower-layer wiring 122 is exposed. As a result, the three-layer insulating layer 17 formed of the silicon dioxide film, the silicon nitride film, and the silicon dioxide film is formed, and a cross section structure depicted in FIG. 10 is obtained.

Figure 11:
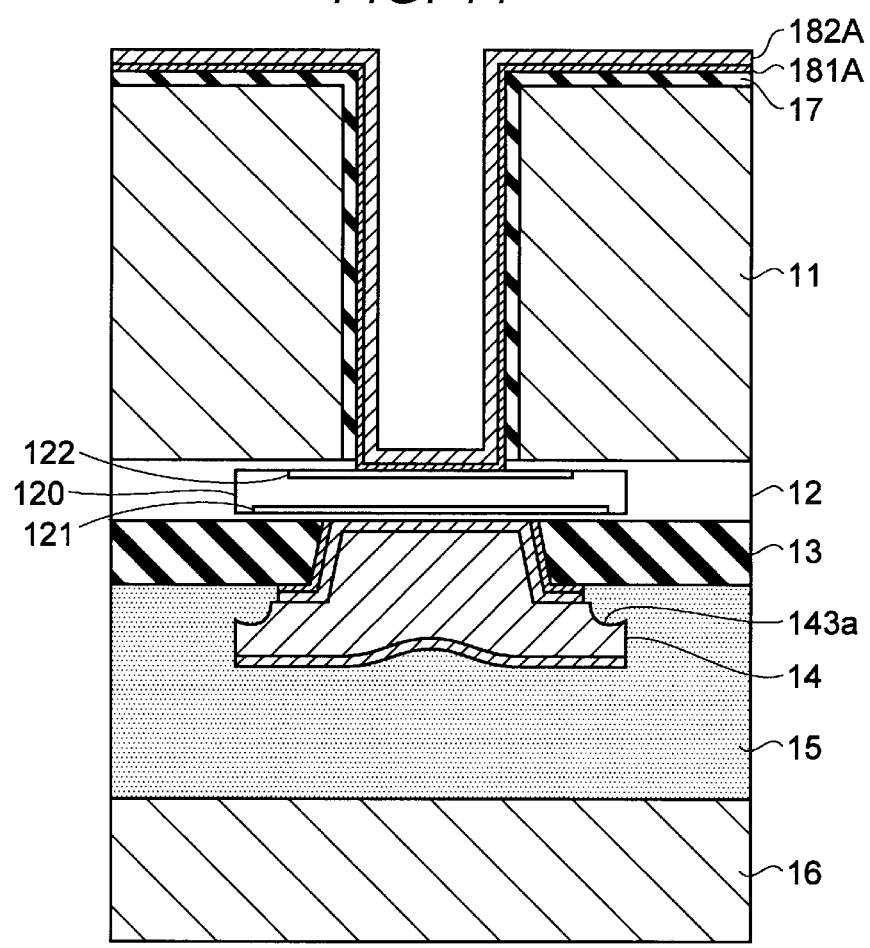
FIG. 11 is a cross-sectional view (VII) depicting the method for producing the semiconductor device according to the first embodiment.

Next, by sequentially stacking a barrier metal layer 181A formed of titanium (Ti) and a seed metal layer 182A formed of copper (Cu) all over the insulating layer 17 including the inside of the through hole in a manner similar to the formation of the barrier metal layer 141A and the seed metal layer 142A, a cross section structure depicted in FIG. 11 is obtained. The film thickness of the seed metal layer 182A may be greater than the film thickness of the seed metal layer 142A.

Then, a mask for forming the through electrode 183 is formed on the seed metal layer 182A in the same manner as the upper-surface through electrode 14, the through electrode 183 is formed on the seed metal layer 182A exposed from the mask by conformal plating, the material film 184 is formed on the through electrode 183, and the unnecessary barrier metal layer 181A and seed metal layer 182A are removed, whereby the semiconductor device 1 with across section structure depicted in FIG. 1 (or FIG. 3) is produced.

As described above, according to the first embodiment, since the size of the head 143c of the through electrode 143 on the upper surface which protrudes from the insulating layer 13 is greater than the size thereof on the lower surface side, the contact area of the adhesive which is used to fix, to the supporting substrate or the like, the semiconductor device 1 or the wafer from which the semiconductor devices 1 are to be cut, for example, can be increased. As a result, the bonding strength between the semiconductor device 1 or the wafer and the supporting substrate or the like can be increased.

Moreover, since the depression 143a is provided from the side surface to the lower surface of the head 143c, the adhesion strength can be further increased by the anchor effect. As a result, the bonding strength between the semiconductor device 1 or the wafer and the supporting substrate or the like can be further increased.

Incidentally, in the above description, as a combination of metallic materials by which the battery effect can be obtained, a combination of copper (the seed metal layer 142/182) and nickel (the through electrode 143/183) is described as an example, but the combination is not limited to this combination. That is, various combinations of metallic materials by which the battery effect can be obtained can be used. In so doing, by using a metallic material with high ionization tendency as the material of the through electrode 143/183, the depression 143a/183a from the side surface to the lower surface of the head of the through electrode can be formed.

Moreover, by adjusting the concentration of an etchant and the processing time at the time of removal of any one of the barrier metal layer 141A and the seed metal layer 142A or both and the film thickness or the like of any one of the barrier metal layer 141A and the seed metal layer 142A or both, the size of the depression 143a can be adjusted. By adjusting the processing conditions at the time of etching of any one of the barrier metal layer 141A and the seed metal layer 142A or both, the inner surface shape of the depression 143a can be controlled.

Second Embodiment

Next, a semiconductor device and a method for producing the semiconductor device according to a second embodiment will be described in detail by using the drawings. In the following description, the same component elements as the component elements of the embodiment described above will be identified with the same characters and overlapping explanations thereof will be omitted.

Figure 12:
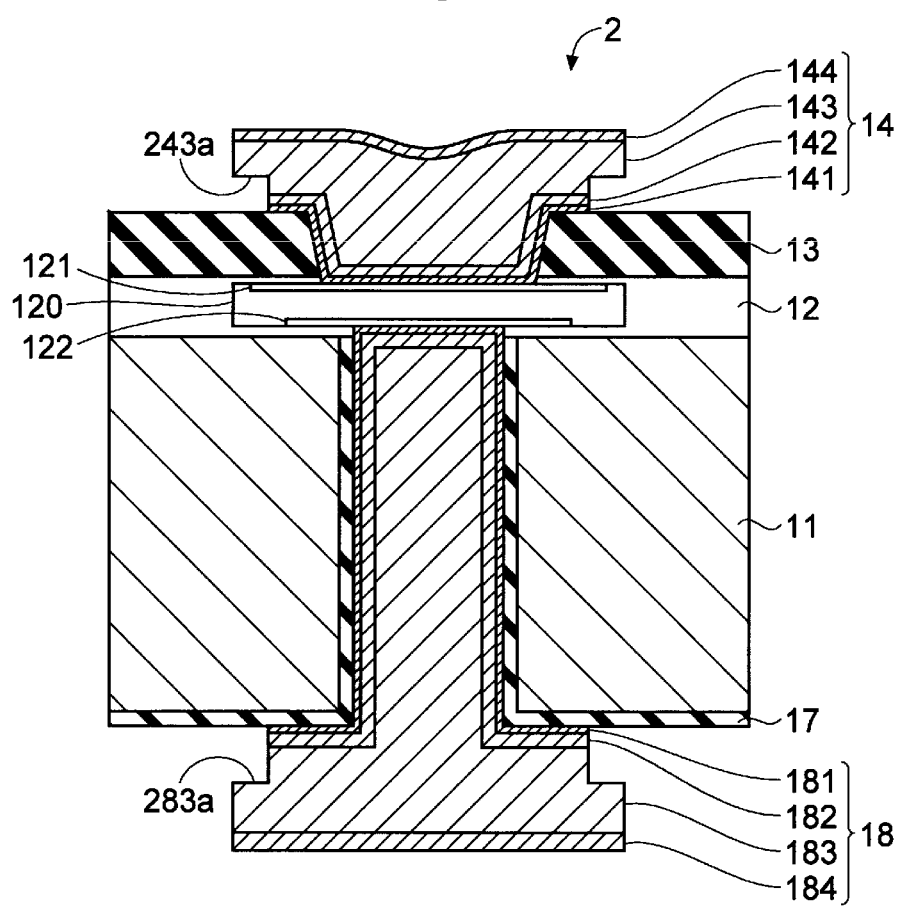
FIG. 12 is a cross-sectional view depicting a schematic configuration example of a semiconductor device according to a second embodiment.

In the first embodiment, the inner surface of the depression 143a formed in the side surface of the through electrode 143 is a curved surface. However, the inner surface of the depression is not limited to a curved surface. FIG. 12 is a sectional view depicting the schematic configuration example of the semiconductor device according to the second embodiment. As depicted in FIG. 12, a semiconductor device according to the second embodiment has, in the same configuration as the configuration of the semiconductor device 1 according to the first embodiment, a depression 243a formed in the side surface of the head of the through electrode 143, the depression 243a whose inner surface is a bent surface obtained by bending a flat surface or has a shape similar to the shape of the bent surface.

Figure 13:
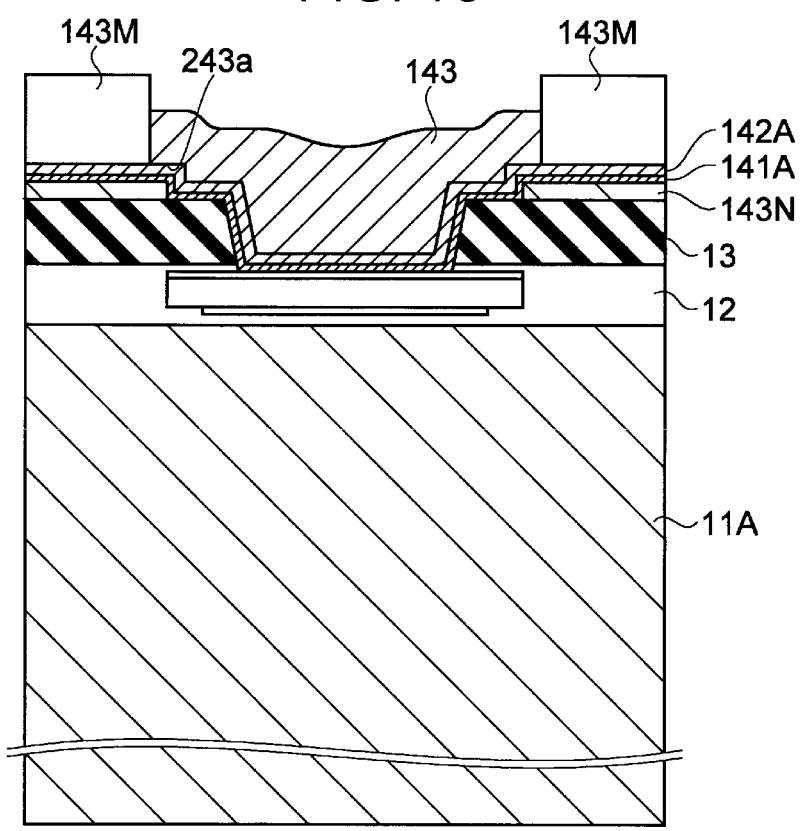
FIG. 13 is a cross-sectional view depicting a method for producing the semiconductor device according to the second embodiment.

The depression 243a formed as a bent surface as depicted in FIG. 12 can be formed by, for example, as depicted in FIG. 13, prior to the formation of the barrier metal layer 141A, forming a sacrifice layer 143N subjected to patterning on the insulating layer 13. As the material of the sacrifice layer 143N, a material, such as a silicon dioxide film, which has a sufficient etching selection ratio with respect to the constituent materials of the insulating layer 13 and the upper-surface through electrode 14 may be used.

As described above, also in the configuration in which the depression 243a having a bent surface as the inner surface thereof is formed in the side surface of the head of the through electrode 143, as is the case with the first embodiment, the size of the head 143c on the upper surface side which protrudes from the insulating layer 13 can be made greater than the size of the head 143c on the lower surface side. As a result, as is the case with the first embodiment, the bonding strength between the semiconductor device 2 or the wafer and the supporting substrate or the like can be increased.

Moreover, as is the case with the depression 143a of the first embodiment, with the depression 243a having a bent surface as the inner surface thereof, the adhesion strength can be increased by the anchor effect. As a result, the bonding strength between the semiconductor device 2 or the wafer and the supporting substrate or the like can be further increased.

Incidentally, what is described about the shape of the depression 243a may also be applied to a depression 283a formed in the through electrode 183 of the lower-surface through electrode 18. Since the other configurations, production method, and effects are the same as the configurations, the production method, and the effects of the first embodiment, detailed explanations thereof are omitted here.

Third Embodiment

Next, a semiconductor device and a method for producing the semiconductor device according to a third embodiment will be described in detail by using the drawing. In the following description, the same component elements as the component elements of the embodiments described above will be identified with the same characters and overlapping explanations thereof will be omitted.

In the embodiments described above, by forming the depression 143a/243a in the through electrode 143, the size of the head on the upper surface side which protrudes from the insulating layer 13 is located is made greater than the size thereof on the lower surface side. However, various other configurations in which the size of the head on the upper surface side is made greater than the size thereof on the lower surface side are possible. For example, by making the head of the through electrode 143 have such a reverse taper shape that the diameter of the head is reduced from the upper surface side of the head to the lower surface side thereof, the size of the head on the upper surface side of the head can be made greater than the size of the head on the lower surface side thereof.

Figure 14:
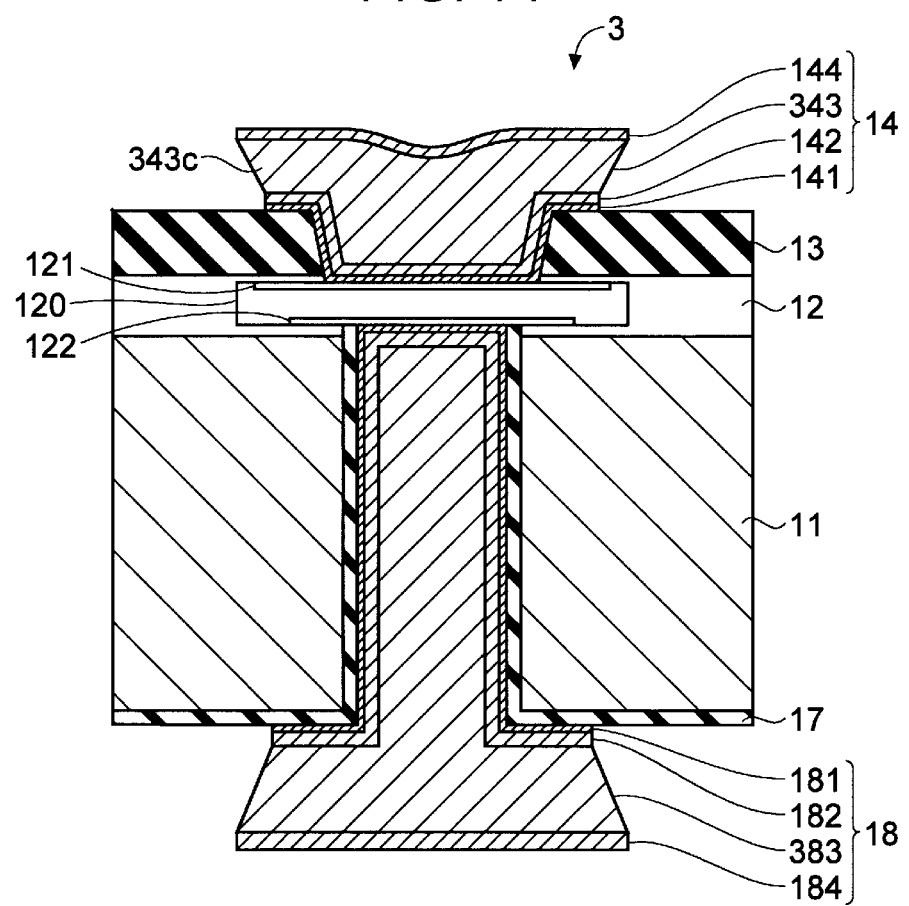
FIG. 14 is a cross-sectional view depicting a schematic configuration example of a semiconductor device according to a third embodiment.

FIG. 14 is a sectional view depicting the schematic configuration example of the semiconductor device according to the third embodiment. As depicted in FIG. 14, a semiconductor device 2 according to the third embodiment has the same configuration as the configuration of the semiconductor device 1 according to the first embodiment except that the through electrode 143 is replaced with a through electrode 343. A head 343c of the through electrode 343 has a reverse taper shape such that the diameter of the head 343c is reduced from the upper surface side of the head 343c to the lower surface side thereof.

The reverse taper shape of the head of the through electrode can be formed by using a method, for example, in which a mortar-like taper shape is adopted as the shape of a through hole of a mask which is used when the through electrode 343 is formed (corresponding to the process of FIG. 7).

As described above, also in the configuration in which the head of the through electrode 343 has a reverse taper shape, as is the case with the first embodiment, the size of the head 143c on the upper surface side which protrudes from the insulating layer 13 can be made greater than the size thereof on the lower surface side. As a result, as is the case with the first embodiment, the bonding strength between the semiconductor device 2 or the wafer and the supporting substrate or the like can be increased.

Incidentally, what is described about the head of the through electrode 343 may also be applied to the shape of the head of a through electrode 383 of the lower-surface through electrode 18. Since the other configurations, production method, and effects are the same as the configurations, the production method, and the effects of the first embodiment, detailed explanations thereof are omitted here.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor substrate;
   a device layer at an upper surface of the semiconductor substrate;
   an insulating layer on an upper surface of the device layer;
   a through electrode extending through a through hole in the insulating layer and electrically connected to a wiring in the device layer at the upper surface of the device layer, the through electrode including a body in the through hole and a head disposed on the body and above an uppermost surface of the insulating layer; and
   a metal layer extending from the upper surface of the insulating layer into the through hole, the metal layer being between the head and upper surface of the insulating layer and between the body and a side surface of the insulating layer in the through hole,
   wherein
   an outer perimeter of the head at an outermost edge of a lower surface thereof that is at a position spaced outwardly from the metal layer is smaller than an outer perimeter of the head at an outermost edge of an upper surface thereof that is spaced from the lower surface, the outermost edge of the lower surface of the head being higher than and spaced from the uppermost surface of the insulating layer.

2. The semiconductor device according to claim 1, wherein the metal layer includes:
   a first metal layer extending from the upper surface of the insulating layer onto a sidewall of the through hole to contact the wiring in the device layer; and
   a second metal layer located on the first metal layer, wherein the through electrode directly contacts the second metal layer.

3. The semiconductor device according to claim 2, wherein an ionization tendency of a metallic material forming the through electrode is higher than an ionization tendency of a metallic material forming the second metal layer.

4. The semiconductor device according to claim 2, wherein
   the through electrode comprises nickel, and
   the second metal layer comprises copper.

5. The semiconductor device according to claim 1, wherein a depression is formed inwardly of a side surface of the head adjacent the lower surface thereof.

6. The semiconductor device according to claim 1, wherein the head has a reverse taper shape such that the outer perimeter of the head is gradually reduced from the upper surface to the lower surface thereof.

7. The semiconductor device according to claim 1, further comprising:
   an electrode extending from a lower surface of the semiconductor substrate to the wiring in the device layer.

8. The semiconductor device according to claim 1, further comprising:
an additional semiconductor substrate;
an additional electrode located at a lower surface of the additional semiconductor substrate, the additional electrode comprising a head portion extending from the lower surface of the additional semiconductor substrate, a perimeter of the head portion on an upper surface thereof is smaller than a perimeter of the head portion on a lower surface thereof; and
an electrical connection portion between the through electrode and the additional electrode.

9. The semiconductor device of claim 8, wherein the electrical connection portion comprises solder.

10. The semiconductor device of claim 8, wherein a portion of the additional electrode extending from, and over, the additional semiconductor substrate overlies a rounded undercut.

11. The semiconductor device of claim 8, wherein a portion of the additional electrode extending from, and over, the additional semiconductor substrate overlies a square undercut.

12. The semiconductor device of claim 8, wherein the additional electrode comprises a through silicon via.

13. The semiconductor device of claim 8, wherein a portion of the through electrode extending from, and over, the semiconductor substrate overlies a rounded undercut.

14. The semiconductor device of claim 1, wherein a thickness of a portion of the head decreases from an outermost edge of the head towards an inward part of the head.

15. The semiconductor device according to claim 1, wherein the through hole includes a portion formed in an organic layer.

16. The semiconductor device according to claim 1, wherein the upper surface of the head is concaved.

17. The semiconductor device according to claim 1, comprising:
an additional semiconductor substrate;
an additional electrode located at a lower surface of the additional semiconductor substrate, the additional electrode comprising a head portion extending from the lower surface of the additional semiconductor substrate; and
an electrical connection portion between the through electrode and the additional electrode,
wherein the head of the additional electrode is covered with the electrical connection portion.

18. The semiconductor device according to claim 1, further comprising:
a film including gold disposed on the upper surface of the head of the through electrode.

19. The semiconductor device according to claim 18, wherein the outer perimeter of the head on the lower surface thereof is larger than an outer perimeter of the body at a position contacting the lower surface of the head.

20. The semiconductor device according to claim 1, further comprising:
an outermost side surface of the metal layer on the uppermost surface of the insulating layer is disposed inwardly, along a direction parallel to the uppermost surface of the insulating layer, of an outermost side surface of the head.

21. The semiconductor device according to claim 1, wherein an ionization tendency of a metallic material forming the through electrode is higher than an ionization tendency of a metallic material forming a layer of the metal layer, the layer of the metal layer being the layer in direct contact with the through electrode.

22. The semiconductor device according to claim 21, wherein
the through electrode comprises nickel, and
the layer in direct contact with the through electrode comprises copper.

23. The semiconductor device according to claim 1, wherein the metal layer is not between a portion of the head and the uppermost surface of the insulating layer along a direction orthogonal to the uppermost surface of the insulating layer.

24. The semiconductor device according to claim 1, further comprising:
an adhesive disposed between and in contact with a portion of the head and the uppermost surface of the insulating layer in a direction orthogonal to the uppermost surface of the insulating layer.

* * * * *